United States Patent
Hanashima et al.

(10) Patent No.: US 10,808,318 B2
(45) Date of Patent: Oct. 20, 2020

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Takeo Hanashima, Toyama (JP); Tsukasa Kamakura, Toyama (JP); Takafumi Sasaki, Toyama (JP); Hidenari Yoshida, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/135,451

(22) Filed: Sep. 19, 2018

(65) Prior Publication Data

US 2019/0017169 A1 Jan. 17, 2019

Related U.S. Application Data

(63) Continuation of application No. PCT/JP2016/059909, filed on Mar. 28, 2016.

(51) Int. Cl.
*C23C 16/458* (2006.01)
*C23C 16/455* (2006.01)
(Continued)

(52) U.S. Cl.
CPC ...... *C23C 16/4584* (2013.01); *C23C 16/4412* (2013.01); *C23C 16/4583* (2013.01);
(Continued)

(58) Field of Classification Search
CPC .......... C23C 16/4584; C23C 16/45574; C23C 16/4412; C23C 16/45578;
(Continued)

(56) References Cited

U.S. PATENT DOCUMENTS

2003/0224615 A1* 12/2003 Nishino ............ H01L 21/31608
438/758
2006/0124058 A1 6/2006 Sakai et al.
(Continued)

FOREIGN PATENT DOCUMENTS

JP 4411215 B 2/2010
JP 2011-187536 A 9/2011
(Continued)

OTHER PUBLICATIONS

International Search Report for PCT/JP2016/059909, dated Jun. 21, 2016.
(Continued)

*Primary Examiner* — Jeffrie R Lund
(74) *Attorney, Agent, or Firm* — Volpe and Koenig, P.C.

(57) ABSTRACT

There is provided a technique that includes: a process chamber accommodating a substrate support supporting substrates in multiple stages to process the substrates; a supply buffer part adjacent the process chamber; a first gas supply part installed in the supply buffer part; a second gas supply part installed in the supply buffer part; an inner wall installed between the supply buffer part and the process chamber, on which a plurality of slits are formed to correspond to the substrates; and a maintenance port disposed at a lower end of the inner wall, wherein the first gas supply part includes a first gas nozzle having a supply hole that supplies first gas into the supply buffer part.

10 Claims, 5 Drawing Sheets

(51) Int. Cl.
*C23C 16/44* (2006.01)
*H01L 21/67* (2006.01)
*H01L 21/673* (2006.01)
*C23C 16/52* (2006.01)
*H01L 21/02* (2006.01)

(52) U.S. Cl.
CPC .. *C23C 16/45546* (2013.01); *C23C 16/45563* (2013.01); *C23C 16/45574* (2013.01); *C23C 16/45578* (2013.01); *C23C 16/52* (2013.01); *H01L 21/67017* (2013.01); *H01L 21/67109* (2013.01); *H01L 21/67389* (2013.01); *H01L 21/67393* (2013.01); *H01L 21/02* (2013.01); *H01L 21/67098* (2013.01); *H01L 21/67248* (2013.01)

(58) Field of Classification Search
CPC .......... C23C 16/45546; C23C 16/4583; C23C 16/52; C23C 16/45563; H01L 21/67017; H01L 21/67393; H01L 21/67109; H01L 21/67248; H01L 21/67389; H01L 21/67098; H01L 21/02

See application file for complete search history.

(56) References Cited

U.S. PATENT DOCUMENTS

| | | | |
|---|---|---|---|
| 2009/0205783 A1* | 8/2009 | Tanabe | C30B 25/14 156/345.37 |
| 2010/0212593 A1* | 8/2010 | Takebayashi | C23C 16/45578 118/725 |
| 2010/0282166 A1* | 11/2010 | Fukuda | C23C 16/45578 118/722 |
| 2015/0368794 A1* | 12/2015 | Morita | C23C 16/22 156/345.24 |
| 2015/0380288 A1* | 12/2015 | Hirano | H01L 21/67379 438/597 |
| 2018/0087152 A1* | 3/2018 | Yoshida | C23C 16/4584 |
| 2018/0210423 A1* | 7/2018 | Yamamoto | H01L 21/02 |
| 2019/0017169 A1* | 1/2019 | Hanashima | C23C 16/4583 |
| 2019/0096738 A1* | 3/2019 | Okajima | C23C 16/45546 |
| 2019/0189490 A1* | 6/2019 | Morita | H01L 21/67781 |
| 2019/0330738 A1* | 10/2019 | Saido | C23C 16/45563 |
| 2019/0393045 A1* | 12/2019 | Yoshida | C23C 16/455 |

FOREIGN PATENT DOCUMENTS

| | | |
|---|---|---|
| JP | 2011-249407 A | 12/2011 |
| JP | 2013-045884 A | 3/2013 |

OTHER PUBLICATIONS

Korean Office Action dated Jan. 15, 2020 for the Korean Patent Application No. 10-2018-7026513.

* cited by examiner

FIG. 5A

| | Top | Center | Bottom |
|---|---|---|---|
| Map | | | |
| Win W | ± 1.01 % | ± 1.17 % | ± 1.08 % |
| WtW | ± 0.27 % | | |

FIG. 5B

| | Top | Center | Bottom |
|---|---|---|---|
| Map | | | |
| Win W | ± 1.63 % | ± 1.32 % | ± 1.19 % |
| WtW | ± 2.63 % | | |

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2016/059909, filed Mar. 28, 2016, the entire contents of which are incorporated herein by reference.

TECHNICAL FIELD

The present disclosure relates to a substrate processing apparatus, a method of manufacturing a semiconductor device, and a recording medium.

BACKGROUND

In the substrate processing of the manufacturing process of a semiconductor device, for example, a vertical type substrate processing apparatus is used to support a plurality of substrates on a substrate support and process them together. In the vertical type substrate processing apparatus, the uniformity of a film of the substrates (inter-plane uniformity) may vary in the vertical direction of the substrate support.

SUMMARY

Some embodiments of the present disclosure provide a technique capable of improving inter-plane uniformity.

According to one embodiment of the present disclosure, there is provided a technique, including: a process chamber configured to accommodate therein a substrate support configured to support a plurality of substrates in multiple stages to process the substrates; a supply buffer part adjacent to the process chamber; a first gas supply part installed in the supply buffer part; a second gas supply part installed in the supply buffer part; an inner wall which is installed between the supply buffer part and the process chamber, and on which a plurality of slits are formed so as to correspond to the substrates supported by the substrate support; and a maintenance port disposed at a lower end of the inner wall. The first gas supply part includes a first gas nozzle having a supply hole which is opened upward at a leading end, and the supply hole is disposed at a position which is equal to or lower than a height of the substrate at a lowermost end of the substrate support and which is higher than a height of an upper end of the maintenance port and is configured to supply a first gas into the supply buffer part.

BRIEF DESCRIPTION OF DRAWINGS

FIG. 5A is a diagram showing film formation results according to an example and FIG. 5B is a diagram showing film formation results according to a comparative example.

DETAILED DESCRIPTION

Figure 1:
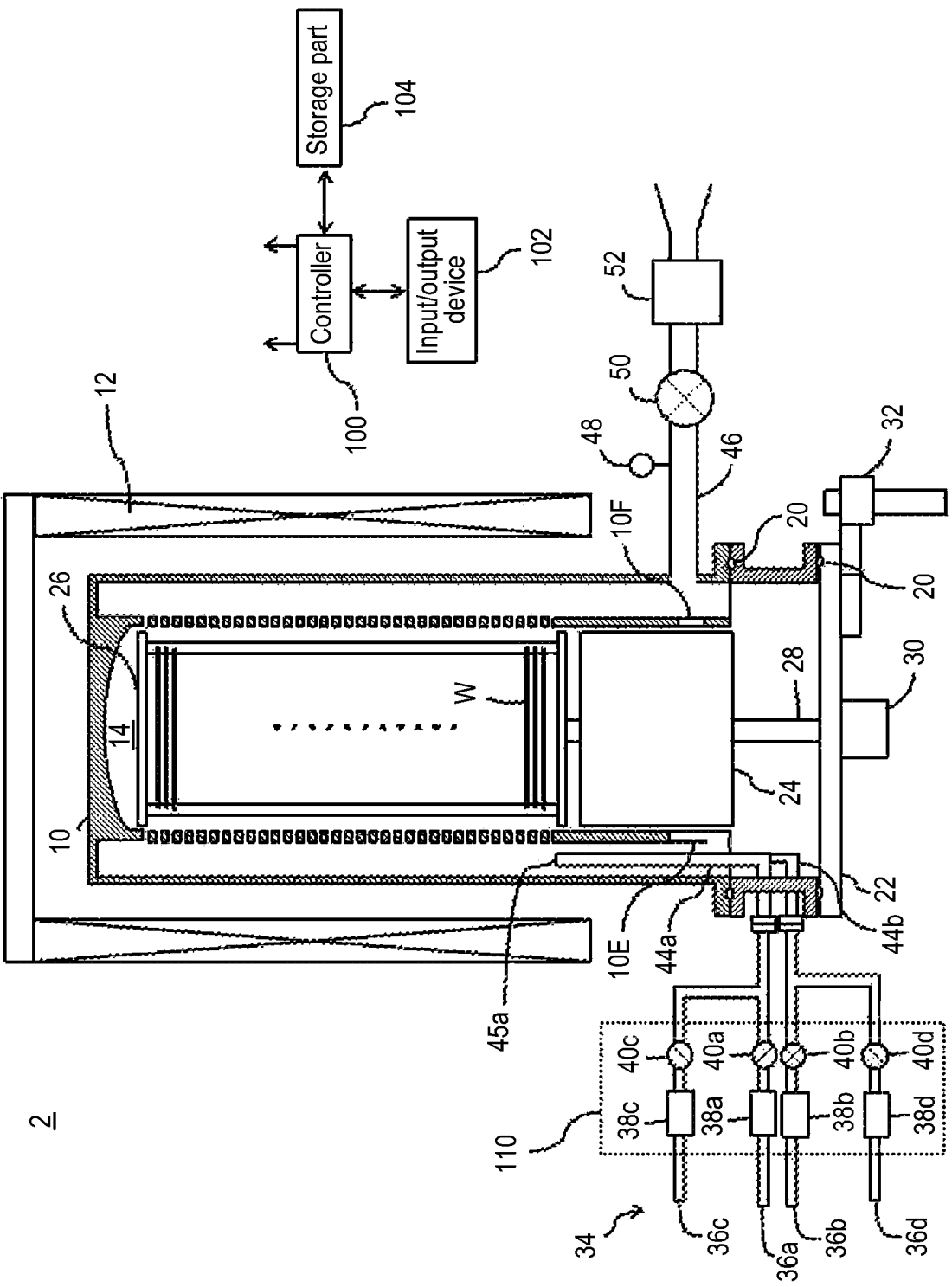
FIG. 1 is a vertical cross sectional view schematically illustrating an example of a substrate processing apparatus used in one embodiment of the present disclosure.

A non-limiting exemplary embodiment of the present disclosure will now be described with reference to the drawings. In all the drawings, like or corresponding components are given like or corresponding reference numerals and a repeated description thereof will be omitted.

In the present embodiment, a substrate processing apparatus is configured as a vertical type substrate processing apparatus (hereinafter, referred to as a processing apparatus) 2 that performs substrate processing such as heat treatment, which is one of the manufacturing processes in the method of manufacturing a semiconductor device. As illustrated in FIG. 1, the processing apparatus 2 includes a cylindrical reaction tube 10 and a heater 12 as a heating means (heating mechanism) installed on an outer periphery of the reaction tube 10. The reaction tube is made of, for example, quartz or SiC. A process chamber 14 configured to process wafers W as substrates is formed inside the reaction tube 10.

Figure 2:
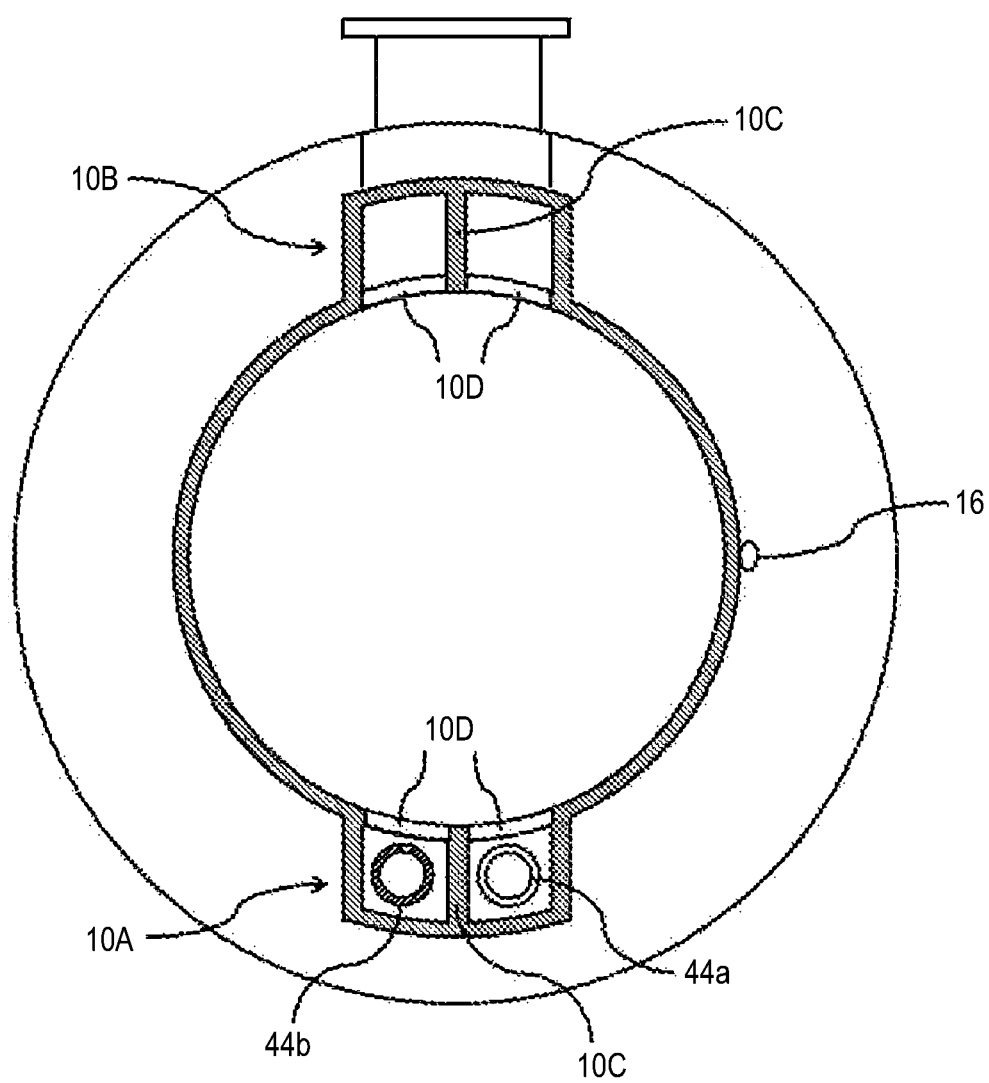
FIG. 2 is a plan view schematically illustrating an example of the substrate processing apparatus used in one embodiment of the present disclosure.

As illustrated in FIG. 2, a supply buffer part 10A and an exhaust buffer part 10B are formed in the reaction tube 10 so as to protrude outward and face each other. The interior of the supply buffer part 10A and the interior of the exhaust buffer part 10B are partitioned into a plurality of spaces by partition walls 10C, respectively. The supply buffer part 10A is partitioned into an installation space of a nozzles 44a and an installation space of a nozzles 44b, where the nozzles 44a and 44b as described hereinbelow are respectively installed. A temperature detection part 16 as a temperature detector is installed in the reaction tube 10. The temperature detection part 16 is erected along an outer wall of the reaction tube 10.

As illustrated in FIG. 1, a plurality of slits 10D are formed on inner walls (on the side of the process chamber 14) of the supply buffer part 10A and the exhaust buffer part 10B. The plurality of slits 10D are formed in multiple stages at height positions corresponding to the respective wafers W supported by a boat 26, which will be described later, to have at least the same number of slits as the wafers W. A maintenance port 10E is formed at a lower end of the inner wall of the supply buffer part 10A. By installing the maintenance port 10E, the nozzles 44a and 44b can be easily installed, thereby improving the maintainability. In addition, an exhaust port 10F is formed on the inner wall of the exhaust buffer part 10B and at a position facing an exhaust pipe 46. By installing the exhaust port 10F, the atmosphere around a heat insulating part 24 can be exhausted.

A cylindrical manifold 18 is connected to a lower end opening of the reaction tube 10 via a seal member 20 such as an O-ring to support the lower end of the reaction tube 10. The manifold 18 is made of metal such as, e.g., stainless steel. A lower end opening of the manifold 18 is opened and closed by a disc-like lid part 22. The lid part 22 is made of, for example, metal. The seal member 20 such as an O-ring is installed on an upper surface of the lid part 22 so that the interior of the reaction tube 10 and an ambient air are hermetically sealed. The heat insulating part 24 in which holes are vertically formed is held at the center on the lid part 22. The heat insulating part 24 is made of, for example, quartz or SiC.

The process chamber 14 houses therein the boat 26 as a substrate support configured to vertically support a plurality of wafers W, for example, 25 to 150 wafers, in a shelf shape. The boat 26 is made of, for example, quartz or SiC. The boat 26 is supported above the heat insulating part 24 by a rotary shaft 28, which penetrates the lid part 22 and the heat insulating part 24. For example, a magnetic fluid seal is installed in a portion through which the rotary shaft 28 of the lid part 22 penetrates, and the rotary shaft 28 is connected to a rotation mechanism 30 installed under the lid part 22. Accordingly, the rotary shaft 28 is configured to be rotatable while hermetically sealing the interior of the reaction tube 10. The lid part 22 is vertically driven by a boat elevator 32 as an elevating mechanism. Thus, the boat 26 and the lid part 22 are integrally moved up and down, and the boat 26 is loaded into and unloaded from the reaction tube 10.

The processing apparatus 10 includes a gas supply mechanism 34 that supplies a gas to be used for substrate processing into the process chamber 14. The gas supplied by the gas supply mechanism 34 may be changed according to the type of a film to be formed. Here, the gas supply mechanism 34 includes a precursor gas supply part, a reaction gas supply part, and an inert gas supply part.

The precursor gas supply part includes a gas supply pipe 36a, in which a mass flow controller (MFC) 38a, which is a flow rate controller (flow rate control part), and a valve 40a, which is an opening/closing valve, are installed in the gas supply pipe 36a sequentially from the corresponding upstream side. The gas supply pipe 36a is connected to the nozzle 44a which penetrates a sidewall of the manifold 18. The nozzle 44a is erected along a vertical direction within the installation space of the nozzle 44a (precursor gas nozzle installation space) of the supply buffer part 10A. A supply hole 45a is formed at a leading end of the nozzle 44a so as to be opened upward. The nozzle 44a has a short tube shape (short nozzle), and is formed to be shorter in overall length than the nozzle 44b which will be described later. With this configuration, a precursor gas can be uniformly diffused into the supply buffer part 10A. The precursor gas is diffused into the precursor gas nozzle installation space of the supply buffer part 10A via the supply hole 45a of the nozzle 44a and then supplied to the wafers W via the slits 10D of the supply buffer part 10A. That is, the precursor gas is supplied (diffused) in two stages into the supply buffer part 10A and into the process chamber 14.

Figure 3:
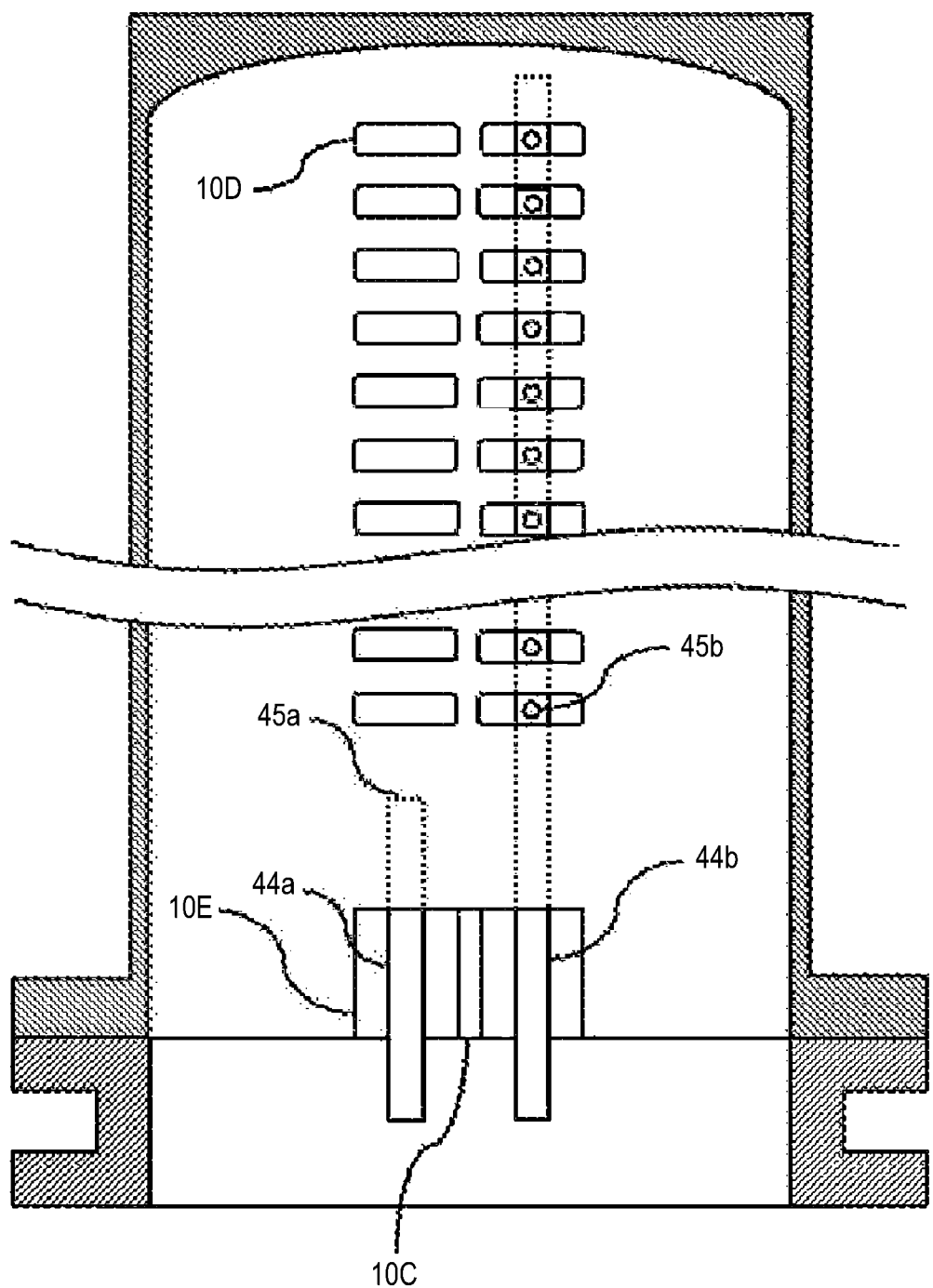
FIG. 3 is a vertical cross sectional view schematically illustrating an example of a reaction tube used in one embodiment of the present disclosure.

The reaction gas supply part includes a gas supply pipe 36b, in which an MFC 38b and a valve 40b are installed in a gas supply pipe 36b sequentially from the corresponding upstream side. The gas supply pipe 36b is connected to the nozzle 44b which penetrates a sidewall of the manifold 18. As illustrated in FIG. 3, the nozzle 44b is erected along the vertical direction within the installation space (reaction gas nozzle installation space) of the nozzle 44b of the supply buffer part 10A. In addition, a plurality of supply holes 45b which are opened toward the wafers W supported by the boat 26 are formed in the nozzle 44b. In this manner, the nozzle 44b is formed in a long tube shape (long nozzle). A reaction gas is diffused into the reaction gas nozzle installation space of the supply buffer part 10A via the supply holes 45b of the nozzle 44b and is supplied from the slits 10D of the supply buffer part 10A to the wafers W.

Hereinafter, in the same configuration, an inert gas is supplied from the inert gas supply part to the wafers W via supply pipes 36c and 36d, MFCs 38c and 38d, valves 40c and 40d, the nozzles 44a and 44b and the slits 10D.

Any one or all of the various supply systems described above may be configured as an integrated gas supply system 100 in which the valves 243a to 243d, the MFCs 241a to 241d, and the like are integrated. The integrated gas supply system 100 is connected to each of the gas supply pipes 232a to 232d, and is configured such that the supply operations of various kinds of gases into the gas supply pipes 232a to 232d, namely the opening/closing operation of the valves 243a to 243d, the flow rate adjusting operation by the MFCs 241a to 241d or the like, are controlled by a controller 100 which will be described later. The integrated gas supply system 100 is configured as an integral type or division type integrated unit, and is also configured such that it is detachable from the gas supply pipes 232a to 232d or the like to perform the maintenance, replacement, expansion or the like of the gas supply system, on an integrated unit basis.

As illustrated in FIG. 1, the exhaust pipe 46 is installed in the reaction tube 10 so as to communicate with the exhaust buffer part 10B. A vacuum pump 52 as a vacuum exhaust device is connected to the exhaust pipe 46 via a pressure sensor 48 as a pressure detector (pressure detection part) which detects the internal pressure of the process chamber 14 and an auto pressure controller (APC) valve 40 as a pressure regulator (pressure regulation part). With this configuration, it is possible to set the internal pressure of the process chamber 14 at a processing pressure according to the processing.

The controller 100 is connected to the rotation mechanism 30, the boat elevator 32, the MFCs 38a to 38d and the valves 40a to 40d of the gas supply mechanism 34, and the APC valve 50, in order to control them. The controller 100 is constituted by, for example, a microprocessor (computer) including a CPU, and is also configured to control the operation of the processing apparatus 2. An input/output device 102 such as a touch panel or the like, is connected to the controller 100.

A storage part 104 as a storage medium is connected to the controller 100. A control program for controlling the operation of the processing apparatus 10 and a program (recipe) for causing each component of the processing apparatus 2 to execute the processing according to processing conditions are readably stored in the storage part 104.

The storage part 104 may be a memory device (a hard disk or a flash memory) incorporated in the controller 100, or may be an external recording device (a magnetic tape, a magnetic disk such as a flexible disk or a hard disk, an optical disc such as a CD or a DVD, a magneto-optical disc such as an MO, or a semiconductor memory such as a USB memory or a memory card). Furthermore, the program may be supplied to the computer using a communication means such as the Internet or a dedicated line. The program is read out from the storage part 104 according to an instruction from the input/output device 102 or the like as necessary, and the processing apparatus 2 executes desired processing under the control of the controller 100 by causing the controller 100 to execute the processing according to the recipe thus read.

(2) Film Forming Process

A sequence example of forming a film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 100.

Figure 4:
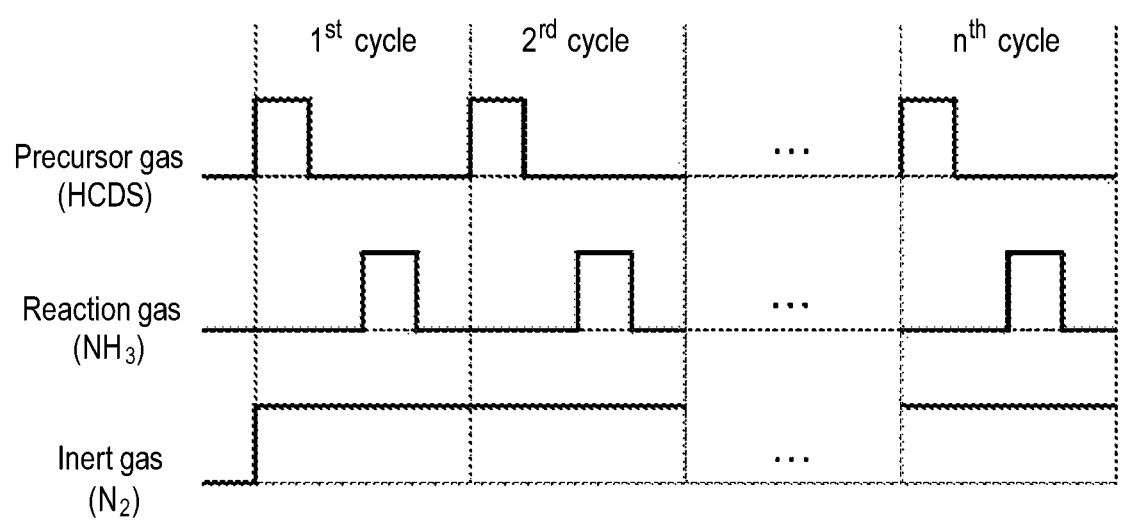
FIG. 4 is a diagram illustrating a gas supply timing in a film forming process according to one embodiment of the present disclosure.

In the film forming sequence illustrated in FIG. 4, a cycle which non-simultaneously, i.e., non-synchronously, performs a step 1 of supplying a hexachlorodisilane ($Si_2Cl_6$, abbreviation: HCDS) gas which is an Si-containing gas as a precursor gas to a wafer W accommodated within a process vessel (in the process chamber 41) and a step 2 of supplying an ammonia (NH$_3$) gas as a reaction gas into the process vessel which is under a pressure lower than a heated atmospheric pressure is implemented a predetermined number of times (n times or more) to form a silicon nitride (SiN) film on the wafer W.

In the present disclosure, for the sake of convenience, the sequence of the film forming process described above may sometimes be denoted as follows. The same denotation will be used in other embodiments as described hereinbelow.

(HCDS→NH$_3$)×n⇒SiN

When the term "wafer (substrate)" is used herein, it may refer to "a wafer itself" or "a laminated body (aggregate) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface of a wafer itself" or that "a predetermined layer (or film) is formed on a layer or film formed on a wafer, namely on an uppermost surface of a wafer as a laminated body."

(Wafer Charging and Boat Loading)

If a plurality of wafers W is charged on the boat 26 (wafer charging), the boat 26 is loaded into the process chamber 14 by the boat elevator 32 (boat loading), and the lower portion opening of the reaction tube 10 is hermetically sealed by the lid part 22.

(Pressure Regulation and Temperature Adjustment)

The interior of the process chamber 14 is vacuum-exhausted (depressurization-exhausted) by the vacuum pump 52 so as to reach a desired pressure (degree of vacuum). The internal pressure of the process chamber 14 is measured by the pressure sensor 48. The APC valve 50 is feedback-controlled based on the measured pressure information. Furthermore, the wafers W in the process chamber 14 are heated by the heater 12 to a desired temperature. In this operation, a state of supplying electric power to the heater 12 is feedback-controlled based on the temperature information detected by the temperature detection part 16 such that the interior of the process chamber 14 has a desired temperature distribution. In addition, the rotation of the boat 26 and the wafers W by the rotation mechanism 30 begins. The heating of the interior of the process chamber 14 by the heater 12 may be continuously performed at least until the processing of the wafers W is completed. The rotation of the boat 26 and the wafers W by the rotation mechanism 30 may be continuously performed at least until the processing of the wafers W is completed.

(Film Forming Step)

When the internal temperature of the process chamber 14 stabilizes at a predetermined processing temperature, the following steps 1 and 2 are sequentially performed.

[Step 1]

At this step, an HCDS gas is supplied to the wafer W accommodated within the process chamber 14.

The valve 40a is opened to allow an HCDS gas to flow through the gas supply pipe 36a. The flow rate of the HCDS gas is adjusted by the MFC 38a. The HCDS gas is diffused into the supply buffer part 10A via the nozzle 44a, is supplied into the process chamber 14 via the slits 10D and is exhausted from the exhaust pipe 46. At this time, the HCDS gas is supplied to the wafer W. Simultaneously, the valve 40c is opened to allow an N$_2$ gas to flow through the gas supply pipe 36c. The flow rate of the N$_2$ gas is adjusted by the MFC 38c. The N$_2$ gas is diffused into the supply buffer part 10A via the gas supply pipe 36a and the nozzle 44a, is supplied into the process chamber 14 via the slits 10D supplied into the process chamber 14 and is exhausted from the exhaust pipe 46. Furthermore, in order to prevent the HCDS gas from entering the nozzle 44b, the valve 40d is opened to allow the N$_2$ gas to flow through the gas supply pipe 36d. The N$_2$ gas is supplied into the process chamber 14 via the gas supply pipe 36b, the nozzle 44b, the supply buffer part 10A and the slits 10D and is exhausted from the exhaust pipe 46.

At this time, the internal pressure of the process chamber 14 may be set at a pressure which falls within a range of, for example, 1 to 4,000 Pa, 67 to 2,666 Pa, or 133 to 1,333 Pa in some embodiments. The supply flow rate of the HCDS gas may be set at a flow rate which falls within a range of, for example, 1 to 2,000 sccm or 10 to 1,000 sccm in some embodiments. The supply flow rate of the N$_2$ gas supplied from each of the gas supply pipes may be set at a flow rate which falls within a range of, for example, 100 to 10,000 sccm. The supply time period of the HCDS gas may be set at a time period which falls within a range, for example, 1 to 120 seconds or 1 to 60 seconds in some embodiments. The temperature of the heater 12 is set such that the temperature of the wafer W becomes a temperature which falls within a range of, for example, 250 to 700 degrees C., 300 to 650 degrees C. or 350 to 600 degrees C. in some embodiments.

If the temperature of the wafer W is lower than 250 degrees C., HCDS is difficult to be chemisorbed onto the wafer W. Thus, a practical deposition rate may not be obtained. By setting the temperature of the wafer W at 250 degrees C. or higher, it is possible to solve the above problem. By setting the temperature of the wafer W at 300 degrees C. or higher or 350 degrees C. or higher, HCDS can be more sufficiently adsorbed onto the wafer W to obtain a more sufficient deposition rate.

If the temperature of the wafer W exceeds 700 degrees C., an excessive gas phase reaction may occur. Thus, the film thickness uniformity is likely to be deteriorated and the control of the film thickness uniformity is difficult. By setting the temperature of the wafer W to 700 degrees C. or lower, it is possible to suppress the deterioration of the film thickness uniformity while generating a moderate gas phase reaction and to control the film thickness uniformity. In particular, by setting the temperature of the wafer W at 650 degrees C. or lower or 600 degrees C. or lower, the surface reaction becomes dominant over the gas phase reaction. Thus, it is easy to secure the film thickness uniformity and to control the film thickness uniformity. From these results, the activation temperature of the HCDS gas is considered to be around about 600 degrees C.

Accordingly, it is desirable that the temperature of the wafer W be set at a temperature which falls within a range of 250 to 700 degrees C., 300 to 650 degrees C. or 350 to 600 degrees C. in some embodiments. That is, it is desirable that the temperature of the wafer W be set at a temperature which falls within a range around the activation temperature of the HCDS gas.

Here, as illustrated in FIGS. 1 and 3, the nozzle 44a is installed such that the supply hole 45a is located at a height same as or below the height of the wafer W at a lowermost end of the boat 26. In other words, the nozzle 44a is installed such that the supply hole 45a is located at the height same as or below the height of the lowermost slit of the slits 10D.

If the height of the supply hole 45a is higher than the height of the lowermost wafer W of the boat 26, the internal pressure of the nozzle 44a increases. Thus, a decomposition reaction of the HCDS gas ($Si_2Cl_6 \Rightarrow SiCl_2 + SiCl_4$) is likely to occur in the nozzle 44a. Accordingly, the state (decomposition state) of the HCDS gas in the supply buffer part 10A may be different in the vertical direction, which deteriorates the inter-plane uniformity. By setting the height of the supply hole 45a to be equal to or lower than the height of the lowermost wafer W of the boat 26, it is possible to suppress the decomposition of the HCDS gas in the nozzle 44a and to make the state of the HCDS gas in the supply buffer part 10A uniform in the vertical direction.

Accordingly, in some embodiments, the height of the supply hole 45a may be set equal to or lower than the height of the lowermost wafer W of the boat 26. With this configuration, it is possible to set the internal pressure of the nozzle 44a at a pressure at which the HCDS gas is not decomposed. Here, the decomposition of the HCDS gas may include not only a case where the HCDS gas is completely decomposed but also a case where the HCDS gas is slightly not decomposed but which is substantially the same as the case where the HCDS gas is completely decomposed.

In addition, the nozzle 44a is configured such that the supply hole 45a is located above the height of the lower end of the partition wall 10C in the supply buffer part 10A. That is, the nozzle 44a is configured such that the supply hole 45a is located above the height of the lower end of the heat insulating part 24. In some embodiments, it is desirable that the height of the supply hole 45a may be set higher than the height of the upper end of the maintenance port 10E.

If the height of the supply hole 45a is equal to or lower than the height of the lower end of the partition wall 10C, the HCDS gas may flow out from the lower portion of the supply buffer part 10A into the process chamber 14 or the HCDS gas may flow out into the installation space of the nozzle 44b. This makes it impossible to diffuse a sufficient amount of HCDS gas into the supply buffer part 10A (into the installation space of the nozzle 44a), making the in-plane/inter-plane uniformity deteriorated. Furthermore, byproducts may adhere to the inner wall of the installation space of the nozzle 44b or the heat insulating part 24. By setting the height position of the supply hole 45a higher than the height position of the lower end of the partition wall 10C, it is possible to improve the inter-plane uniformity and to suppress the generation of the byproduct. In addition, by setting the height of the supply hole 45a higher than the height of the upper end of the maintenance port 10E, it is possible to further suppress the outflow of the HCDS gas into the process chamber 14.

Accordingly, in some embodiments, the height of the supply hole 45a may be set higher than the height of the lower end of the partition wall 10C in the supply buffer part 10A. Further, in some embodiments, the height of the supply hole 45a may be set higher than the height of the upper end of the maintenance port 10E.

By supplying the HCDS gas to the wafer W under the aforementioned conditions, an Si-containing layer as a first layer (initial layer) having a thickness of, for example, about from less than one atomic layer to several atomic layers (from less than one molecular layer to several molecular layers), is formed on the uppermost surface of the wafer W. The Si-containing layer may be an Si layer containing Cl or an adsorption layer of HCDS, or may include both of them.

After the first layer is formed, the valve 40a is closed to stop the supply of the HCDS gas. At this time, the interior of the process chamber 14 is vacuum-exhausted by the vacuum pump 52 while opening the APC valve 50. Thus, the unreacted HCDS gas or the HCDS gas contributed to the formation of the first layer, which remains within the process chamber 14, is removed from the interior of the process chamber 14. At this time, the supply of the $N_2$ gas into the process chamber 14 is maintained while opening the valves 40c and 40d. The $N_2$ gas acts as a purge gas. At this time, the gas remaining within the process chamber 14 may not be completely removed and the interior of the process chamber 14 may not be completely purged.

As the precursor gas, it may be possible to use, in addition to the HCDS gas, for example, an inorganic precursor gas such as a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas or a monosilane ($SiH_4$, abbreviation: MS) gas, or an organic precursor gas such as a tetrakis-dimethylaminosilane ($Si[N(CH_3)_2]_4$, abbreviation: 4DMAS) gas, a tris-dimethylaminosilane ($Si[N(CH_3)_2]_3H$, abbreviation: 3DMAS) gas, a bis-diethylaminosilane ($Si[N(C_2H_5)_2]_2H_2$, abbreviation: BDEAS) gas, a bis-tertiary-butylaminosilane ($SiH_2[NH(C_4H_9)]_2$, abbreviation: BTBAS) gas or a diisopropylaminosilane ($SiH_3N[CH(CH_3)_2]_2$, abbreviation: DIPAS) gas.

As the inert gas, it may be possible to use, in addition to the $N_2$ gas, a rare gas such as an Ar gas, an He gas, an Ne gas, a Xe gas or the like.

[Step 2]

After step 1 is completed, an $NH_3$ gas is supplied into the process chamber 14.

At this step, the opening/closing control of the valves 40b to 40d is performed in the same procedure as the opening/closing control of the valves 40a, 40c and 40d at step 1. The flow rate of the $NH_3$ gas is adjusted by the MFC 38b. The $NH_3$ gas is supplied into the process chamber 14 via the nozzle 44b.

At this time, the internal pressure of the process chamber 14 may be set at a pressure which is lower than an atmospheric pressure and which falls within a range of, for example, 1 to 1,333 Pa. The supply flow rate of the $NH_3$ gas may be set at a flow rate which falls within a range of, for example, 1,000 to 10,000 sccm. The supply time period of the $NH_3$ gas may be set at a time period which falls within a range of, for example, 1 to 120 seconds. Other processing conditions may be similar to, for example, the processing conditions of step 1.

By supplying the $NH_3$ gas into the process chamber 14 under the aforementioned conditions, the first layer formed on the wafer W at step 1 is nitrided, and the first layer is changed (modified) into a second layer, i.e., an SiN layer.

(Residual Gas Removal)

After the first layer is modified into the second layer (SiN layer), the valve 40b is closed to stop the supply of the $NH_3$ gas. Then, the $NH_3$ gas or the reaction byproduct, which remains within the process chamber 14, is removed from the interior of the process chamber 14 under the same processing procedures and processing conditions as those of step 1.

As the reaction gas, it may be possible to use, in addition to the $NH_3$ gas, an oxygen ($O_2$) gas or the like. As the inert gas, it may be possible to use, in addition to the $N_2$ gas, various kinds of rare gases exemplified at, for example, step 1.

[Performing a Predetermined Number of Times]

A cycle which non-simultaneously, i.e., non-synchronously, performs steps 1 and 2 described above is implemented a predetermined number of times (n times). Thus, an SiN film having a predetermined thickness can be formed on the wafer W. The aforementioned cycle may be repeated multiple times. That is, the thickness of the second layer formed per one cycle may be set smaller than a desired thickness and the aforementioned cycle may be repeated multiple times until the thickness of the film formed by laminating the second layer becomes equal to the desired thickness.

(Boat Unloading and Wafer Discharging)

After the film having a predetermined thickness is formed, an $N_2$ gas is supplied from the inert gas supply part, the interior of the process chamber 14 is substituted by an $N_2$ gas, and the pressure of the process chamber 14 is returned to an atmospheric pressure. Thereafter, the lid part 22 is moved down by the boat elevator 32, and the boat 26 is unloaded from the reaction tube 10 (boat unloading). Thereafter, the processed wafers W are discharged from the boat 26 (wafer discharging).

Effects According to the Present Embodiment

According to the present embodiment, one or more effects as set forth below may be achieved.

(a) By supplying the precursor gas in two stages into the supply buffer part and the process chamber when supplying the precursor gas to the process chamber, it is possible to uniformly diffuse the precursor gas in the supply buffer part in the vertical direction and to supply the precursor gas into the process chamber by equalizing the flow rate in the vertical direction. This makes it possible to improve the inter-plane uniformity.

(b) By using the short nozzle as the nozzle for supplying the precursor gas, it is possible to suppress the increase in the internal pressure of the nozzle, to suppress the decomposition of the precursor gas in the nozzle, and to improve the in-plane/inter-plane uniformity.

When the temperature of the film forming process is near the activation temperature of the precursor gas, the precursor gas is easily decomposed only by the influence of the temperature. In such a state, when a long nozzle is used for supplying the precursor gas, there may be a case where the influence of the internal pressure of the long nozzle is also added to promote the decomposition of the precursor gas in the long nozzle, which adversely affects the inter-plane uniformity.

On the other hand, according to the present embodiment, by supplying the precursor gas from the short nozzle, it is possible to suppress the influence of the internal pressure of the nozzle and to suppress the decomposition of the precursor gas in the nozzle.

(c) By using the short nozzle as the nozzle for supplying the precursor gas, it is possible to reduce the residual amount of the precursor gas in the nozzle. This makes it possible to suppress the generation of stagnation in the nozzle, to suppress the generation of byproduct in the nozzle, and to improve the film quality.

(d) By using the short nozzle as the nozzle for supplying the precursor gas and diffusing the precursor gas into the supply buffer part, it is possible to make the decomposed state of the precursor gas in the supply buffer part uniform in the vertical direction. This makes it possible to equalize the inter-plane film thickness distribution tendency and to equalize the values of the in-plane uniformity between the surfaces. Furthermore, it is possible to broaden the range of the film-forming conditions such as the supply flow rate of the precursor gas.

(e) By using the short nozzle as the nozzle for supplying the precursor gas and diffusing the precursor gas into the supply buffer part, it is possible to improve the inter-plane uniformity without adjusting the setting of the heater each time according to the film thickness of the wafer. This makes it possible to suppress the variation of electrical characteristics due to the temperature adjustment.

The embodiment of the present disclosure has been specifically described above. However, the present disclosure is not limited to the aforementioned embodiment and may be differently modified without departing from the spirit of the present disclosure.

For example, in the aforementioned embodiment, there has been described an example in which an HCDS gas is used as the precursor gas. However, the present disclosure is not limited to such a form. For example, a precursor gas whose temperature zone in the film forming process is near the activation temperature may be used. That is, a precursor gas having high reactivity in the temperature zone of the film forming process may be used.

Furthermore, for example, in the aforementioned embodiment, there has been described an example in which an SiN film is formed. However, the present disclosure is not limited to such a form. For example, beside these or in addition to these, an SiO film, an SiON film, an SiOCN film, an SiOC film, an SiCN film, an SiBN film, an SiBCN film or the like may be formed by using an oxygen (O)-containing gas (oxidizing gas) such as an oxygen ($O_2$) gas, a carbon (C)-containing gas such as a propylene ($C_3H_6$) gas, or a boron (B)-containing gas such as a boron trichloride ($BCl_3$) gas. Even in the case of forming these films, the films may be formed under the same processing conditions as those of the aforementioned embodiment, and effects similar to those of the aforementioned embodiment may be achieved. At this time, an oxygen (O)-containing gas (oxidizing gas) such as an oxygen ($O_2$) gas, carbon (C)-containing gas such as a propylene ($C_3H_6$) gas, or a boron (B)-containing gas such as a boron trichloride ($BCl_3$) gas is supplied from the nozzle 44b.

In addition, the embodiment and modifications described above may be appropriately combined with one another. The processing conditions used at this time may be similar to, for example, the processing conditions of the embodiment and modifications described above.

Examples

Hereinafter, experimental results supporting the effects obtained from the aforementioned embodiment will be described.

In an example, a film forming process of forming an SiN film on a plurality of wafers was performed by the film forming sequence illustrated in FIG. 4 using the substrate processing apparatus according to the aforementioned embodiment. An HCDS gas was used as the precursor gas and an $NH_3$ gas was used as the reaction gas. The processing conditions of the film forming process were set to conditions which fall within the range of the processing conditions denoted in the aforementioned embodiment.

In a comparative example, a film forming process was performed to form an SiN film on a plurality of wafers by the film forming sequence illustrated in FIG. 4 using a long nozzle similar to the nozzle 44b, instead of the short nozzle, as the nozzle 44a. The processing procedures and processing conditions were set similar to the processing procedures and processing conditions of the example.

FIG. 5A is a diagram showing a film formation distribution according to an example, and FIG. 5B is a diagram showing a film formation distribution according to a comparative example.

According to FIGS. 5A and 5B, it can be seen that the in-plane uniformity (Win W) and the inter-plane uniformity (WtW) can be further improved in the example than in the comparative example.

In the comparative example, a long nozzle having the same configuration as the reaction gas supply nozzle 44b is used as the nozzle for supplying the HCDS gas. When the long nozzle is used, it may be considered that the decomposition reaction of the HCDS gas in the long nozzle is promoted by increasing the internal pressure of the long nozzle. That is, it is considered that the internal pressure of the nozzle is set equal to or higher than a pressure at which the HCDS gas is decomposed by using the long nozzle. The internal pressure of the long nozzle is considered to be about 100 to 1,000 Pa. Since the internal pressure of the long nozzle becomes higher toward the upper portion of the long nozzle, the HCDS gas becomes decomposed toward the upper portion of the long nozzle. In other words, the amount of the HCDS gas in the decomposition state becomes larger toward the upper portion of the long nozzle. That is, there is a difference in the decomposition state of the HCDS gas in the vertical direction in the long nozzle. Therefore, if the HCDS gas is diffused from the long nozzle into the supply buffer part 10A, there may be a difference in the decomposition state of the HCDS gas in the vertical direction in the supply buffer part 10A. As a result, the HCDS gas supplied into the process chamber 14 via the slits 10D is different in the decomposition state of the HCDS gas in the vertical direction, namely since the composition of the HCDS gas is different in the vertical direction, the inter-plane uniformity is considered to be deteriorated.

In the comparative example, the HCDS gas in a decomposed state is large in the upper portion in the supply buffer part 10, and the HCDS gas in an undecomposed state is large in the lower portion. Therefore, since a large amount of HCDS gas in the decomposed state is supplied to the substrate in the Top region, the film thickness distribution has a concave shape whose film thickness is larger toward the outer periphery side of the substrate. Furthermore, since a large amount of HCDS gas in an undecomposed state is supplied to the substrate in the Bottom region, the film thickness distribution has a convex shape whose film thickness is larger toward the inner periphery side of the substrate.

On the other hand, in the example, the short nozzle is used as the nozzle for supplying the HCDS gas. When the short nozzle is used, since the internal pressure of the nozzle can be suppressed from increasing, it is possible to suppress the decomposition reaction of the HCDS gas in the nozzle. That is, by using the short nozzle, it is possible to keep the internal pressure of the nozzle at a pressure lower than the pressure at which the HCDS gas is decomposed.

Furthermore, by diffusing the HCDS gas in the upward direction into the supply buffer part 10A via the short nozzle, it is possible to make the concentration distribution of the HCDS gas uniform in the supply buffer part 10A in the vertical direction. In addition, the HCDS gas can be brought into an undecomposed state in the entire supply buffer part 10A. This makes it possible to supply the HCDS gas from the slits 10D into the process chamber 14 in a state in which the HCDS gas is made uniform in the vertical direction. That is, since the state of the HCDS gas can be equalized in the vertical direction at a time when it passes through the slits 10D, and the state of the HCDS gas can be made uniform in the vertical direction also in the process chamber 14, it is possible to improve the inter-plane uniformity.

Moreover, the HCDS gas supplied in an undecomposed state into the process chamber 14 from the slits 10D is gradually affected by heat as it goes toward the center of the wafer. This makes it possible to cause a decomposition reaction of the HCDS gas near the center of the wafer, in particular, to improve the concave distribution of the substrate in the Top region, and to improve the in-plane uniformity.

According to the present disclosure in some embodiments, it is possible to improve inter-plane uniformity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
 a process chamber configured to accommodate therein a substrate support configured to support a plurality of substrates in multiple stages to process the substrates;
 a supply buffer adjacent to the process chamber;
 a first gas supply part installed in the supply buffer;
 a second gas supply part, which includes a second gas nozzle, installed in the supply buffer;
 an inner wall which is installed between the supply buffer and the process chamber, and on which a plurality of slits are formed so as to correspond to the substrates supported by the substrate support; and
 a maintenance port disposed at a lower end of the inner wall,
 wherein the first gas supply part includes a first gas nozzle having a supply hole which is opened upward at a leading end, and
 wherein the supply hole is disposed at a position which is equal to or lower than a height of the substrate at a lowermost end of the substrate support and which is higher than a height of an upper end of the maintenance port and is configured to supply a first gas into the supply buffer.

2. The apparatus of claim 1, wherein the first gas nozzle is a precursor gas nozzle which feeds a precursor gas; and
 the second gas nozzle is a reaction gas nozzle erected along the substrate support and having a plurality of supply holes which are respectively opened toward the substrates supported by the substrate support.

3. The apparatus of claim 2, wherein an internal pressure of the precursor gas nozzle is a pressure at which the precursor gas is not decomposed in the precursor gas nozzle.

4. The apparatus of claim 3, wherein an internal pressure of the reaction gas nozzle is a pressure at which the precursor gas is decomposed.

5. The apparatus of claim 3, further comprising a heater installed on an outer periphery of the process chamber and configured to heat an interior of the process chamber,
  wherein the heater is configured to heat the interior of the process chamber to a temperature near an activation temperature of the precursor gas.

6. The apparatus of claim 5, wherein the precursor gas is an Si-containing gas.

7. The apparatus of claim 6, wherein the precursor gas is an HCDS gas.

8. The apparatus of claim 3, wherein the first gas supply part and the second gas supply part are partitioned by one partition wall in the supply buffer.

9. A method of manufacturing a semiconductor device, comprising:
  loading a substrate support configured to support a plurality of substrates in multiple stages into a process chamber; and
  processing the plurality of substrates in the process chamber by supplying a precursor gas and a reaction gas respectively from a precursor gas supply part and a reaction gas supply part, which includes a reaction gas nozzle, installed in a supply buffer adjacent to the process chamber via an inner wall,
  wherein the act of processing the plurality of substrates includes:
    supplying the precursor gas from a supply hole, which is formed so as to be opened upward at a leading end of a precursor gas nozzle included in the precursor gas supply part and which is located at a position which is equal to or lower than a height of the substrate at a lowermost end of the substrate support and which is higher than a height of an upper end of a maintenance port disposed at a lower end of the inner wall, into a supply buffer;
    supplying the precursor gas from the supply buffer to each of the plurality of substrates in the process chamber via slits formed on the inner wall to be vertically arranged in a plural number so as to correspond to the substrates supported by the substrate support; and
    supplying the reaction gas from the reaction gas supply part to the plurality of substrates in the process chamber.

10. A non-transitory computer-readable recording medium storing a program that causes a computer to perform a process in a substrate processing apparatus, the process comprising:
  loading a substrate support configured to support a plurality of substrates in multiple stages into a process chamber; and
  processing the plurality of substrates in the process chamber by supplying a precursor gas and a reaction gas respectively from a precursor gas supply part and a reaction gas supply part, which includes a reaction gas nozzle, installed in a supply buffer adjacent to the process chamber via an inner wall,
  wherein the act of processing the plurality of substrates includes:
    supplying the precursor gas from a supply hole, which is formed so as to be opened upward at a leading end of a precursor gas nozzle included in the precursor gas supply part and which is located at a position which is equal to or lower than a height of the substrate at a lowermost end of the substrate support and which is higher than a height of an upper end of a maintenance port disposed at a lower end of the inner wall, into a supply buffer;
    supplying the precursor gas from the supply buffer to each of the plurality of substrates in the process chamber via slits formed on the inner wall to be vertically arranged in a plural number so as to correspond to the substrates supported by the substrate support; and
    supplying the reaction gas from the reaction gas supply part to the plurality of substrates in the process chamber.

* * * * *